US009194908B2

(12) United States Patent
Heidmann

(10) Patent No.: US 9,194,908 B2
(45) Date of Patent: Nov. 24, 2015

(54) METROLOGY FOR CONTACTLESS MEASUREMENT OF ELECTRICAL RESISTANCE CHANGE IN MAGNETORESISTIVE SAMPLES

(71) Applicant: Infinitum Solutions, Inc., Santa Clara, CA (US)

(72) Inventor: Juergen Heidmann, Salinas, CA (US)

(73) Assignee: Infinitum Solutions, Inc., Santa Clara, CA (US)

( * ) Notice: Subject to any disclaimer, the term of this patent is extended or adjusted under 35 U.S.C. 154(b) by 19 days.

(21) Appl. No.: 13/802,087

(22) Filed: Mar. 13, 2013

(65) Prior Publication Data

US 2013/0257461 A1  Oct. 3, 2013

Related U.S. Application Data

(60) Provisional application No. 61/616,739, filed on Mar. 28, 2012.

(51) Int. Cl.
*G01R 31/265* (2006.01)
*G01R 27/02* (2006.01)
*G01R 33/00* (2006.01)

(52) U.S. Cl.
CPC ............ *G01R 31/2656* (2013.01); *G01R 27/02* (2013.01); *G01R 33/0023* (2013.01)

(58) Field of Classification Search
CPC . G01R 27/02; G01R 31/2656; G01R 33/0023
USPC ................. 324/637–646, 202, 225, 228–263, 324/702–703; 359/280–320; 356/32, 35, 356/35.5, 369, 370, 445–448
See application file for complete search history.

(56) References Cited

U.S. PATENT DOCUMENTS

2002/0080355 A1* 6/2002 Maris ............................ 356/432
2004/0239321 A1* 12/2004 Kobayashi et al. ........... 324/249
2008/0151247 A1* 6/2008 Salnik et al. .................. 356/432

(Continued)

OTHER PUBLICATIONS

Bakker, F. (2012). "Thermoelectric effects in magnetic nanostructures," Zernike Institute, PhD Thesis series 2012-21 ISSN: 1570-1530, p. i-128.

(Continued)

*Primary Examiner* — Arleen M Vazquez
*Assistant Examiner* — Lee Rodak
(74) *Attorney, Agent, or Firm* — Silicon Valley Patent Group LLP

(57) ABSTRACT

A metrology device optically measures the electrical conductivity of a magnetic sample, such as a Tunneling Magnetoresistance (TMR) or Giant-Magneto Resistance (GMR) device, using Time Domain Thermo Reflectance (TDTR) to measure a cooling curve for the sample while a magnetic field is applied to the sample. The thermal conductivity of the sample may be determined using the cooling curve and the variation of the cooling curve with varying applied magnetic fields is measured. The electrical conductivity is determined for the sample in the magnetic field based on the thermal conductivity. If desired, single reflectance changes may be measured at a particular delay after heating, and the reflectance change at this delay may be used to determine the electrical conductivity. Of particular interest is the amount of change in electric conductivity for a given applied magnetic field because this yields a measure of the sensitivity of the sensor.

24 Claims, 6 Drawing Sheets

(56) References Cited

U.S. PATENT DOCUMENTS

| | | | |
|---|---|---|---|
| 2009/0212769 A1* | 8/2009 | Stoica et al. | 324/244.1 |
| 2010/0166943 A1* | 7/2010 | Hsu et al. | 427/8 |
| 2010/0332203 A1* | 12/2010 | Maris | 703/6 |

OTHER PUBLICATIONS

Bakker, F. et al. (2011). "Thermoelectric detection of ferromagnetic resonance of a nanoscale ferromagnet," *Physics of Nanodevices*, Zernike Institute for Advanced Materials, University of Groningen, The Netherlands, p. 1-4.

Bauer, G. (2011). "Spin caloritronics," arXiv:1107.4395[*cond-mat.mes-hall*] p. 1-8.

Bauer, G. et al. (2012). "Spin caloritronics," *Nature Materials* 11(5):391-399.

Cahill, D. (2004). "Analysis of heat flow in layered structures for time-domain thermoreflectance," *Rev. Sci. Instrum.* 75(12):5119-5122.

Cahill, D. et al. (2002). "Thermometry and Thermal Transport in Micro/Nanoscale Solid-State Devices and Structures," *J Heat Transfer* 124(2):223-240.

Hatami, M. et al. (2008). "Thermal spin-transfer torques in magnetoelectronic devices," *Physical review letters* 99(6):1-4.

Heikkila, T. et al. (2009). "Spin heat accumulation and its relaxation in spin valves," arXiv:0910.4867v2 [*cond-mat.mes-hall*] No. 10, p. 100408-1-4.

Jeong, T. (2011). "Spin-dependent Heat Transport and Thermal Boundary Resistance," PhD Thesis, Carnegie Mellon University, Pittsburgh, PA, p. i-153.

Jeong, T. et al. (2012). "Giant magneto-thermal conductivity in magnetic multilayers," *IEEE Transactions on Magnetics* 48(11):3031-3034.

Jia, K. et al. (2011). "Thermal spin transfer in Fe-MgO-Fe tunnel junctions," *Physical review letters* 107(17):1-5.

Kimling, J. et al. (2013). "Field-dependent thermal conductivity and Lorenz number in Co/Cu multilayers," *Phys Rev B* 87(13)134406-1-9.

Lin, W. et al. (2011). "Giant thermoelectric effect in $Al_2O_3$ magnetic tunnel junctions," p. 1-9.

Saarikoski, H. et al. (2008). "Charge and spin transport in spin valves with anisotropic spin relaxation," *Physical Review B* 75(7):1-8.

Sales, B. et al. (2004). "Thermal Spin Valves," Condensed Matter Sciences Division, Oak Ridge National Laboratory, Oak Ridge, Tn, arXiv [*cond-mat.str-el*] p. 1-7.

Schmidt, A. (2008)."Optical characterization of thermal transport from the nanoscale to the macroscale," PhD Thesis, Massachusetts Institute of Technology, p. 1-181.

Slachter, A. et al. (2011). "Modeling of thermal spin transport and spin-orbit effects in ferromagnetic/nonmagnetic mesoscopic devices," *Phys Rev B* 84(17):174408-1-11.

Wang, Z. et al. (2001). "Spin-dependent thermal and electrical transport in a spin-valve system," *Phys Rev B*, 63(22):224419-1-8.

Worledge, D. et al. (2003). "Magnetoresistance measurement of unpatterned magnetic tunnel junction wafers by current-in-plane tunneling," *Appl Phys Letters* 83(1):84-86.

Yang, Y. et al. (2006). "Field-dependent thermal and electrical transports in Cu/CoFe multilayer," *Journal of Applied Physics* 99(6):063703-1-5.

* cited by examiner

Thermo-Reflectance measurement principal

US 9,194,908 B2

METROLOGY FOR CONTACTLESS MEASUREMENT OF ELECTRICAL RESISTANCE CHANGE IN MAGNETORESISTIVE SAMPLES

CROSS-REFERENCE TO RELATED APPLICATION(S)

This application claims priority under 35 USC 119 to U.S. Provisional Application No. 61/616,739, filed Mar. 28, 2012, and entitled "Metrology for Contactless Measurement of Electrical Resistance Change in Magnetoresistive Sensors and Magnetic Storage Elements" which is incorporated herein in its entirety by reference.

BACKGROUND

The measurement of resistivity or electrical conductivity of magnetoresistive samples such as a magnetic read sensor and magnetic storage element, including Tunneling Magnetoresistance (TMR) sensors or Giant-Magneto Resistance (GMR) sensors, used in magnetic data recording, magnetic sensors, and Magnetic Random Access memory (MRAM) devices, conventionally requires electrical contact. Contact produces undesirable wear and has associated inaccuracies and is therefore generally unreliable and not cost-efficient. Accordingly, improved methods of measuring resistivity or electrical conductivity are desired.

SUMMARY

A metrology device optically measures the electrical conductivity of a magnetic sample, such as a Tunneling Magnetoresistance (TMR) or Giant-Magneto Resistance (GMR) device, using Time Domain Thermo Reflectance (TDTR) to measure a cooling curve for the sample while a magnetic field is applied to the sample. The thermal conductivity of the sample may be determined using the cooling curve and the variation of the cooling curve with varying applied magnetic fields is measured. The electrical conductivity is determined for the sample in the magnetic field based on the thermal conductivity. If desired, single reflectance changes may be measured at a particular delay after heating, and the reflectance change at this delay may be used to determine the electrical conductivity. Of particular interest is the amount of change in electric conductivity for a given applied magnetic field because this yields a measure of the sensitivity of the sensor. Parameters such as the Resistance-Area-Product or a Magneto-Resistive Ratio may be determined using the conductivity the Magneto-Resistivity being the reciprocal value of the conductivity. Additionally, the resistivity may be measured at different applied magnetic fields and a transfer curve, hysteresis, or Barkhausen jumps may be measured.

DETAILED DESCRIPTION

Figure 1:
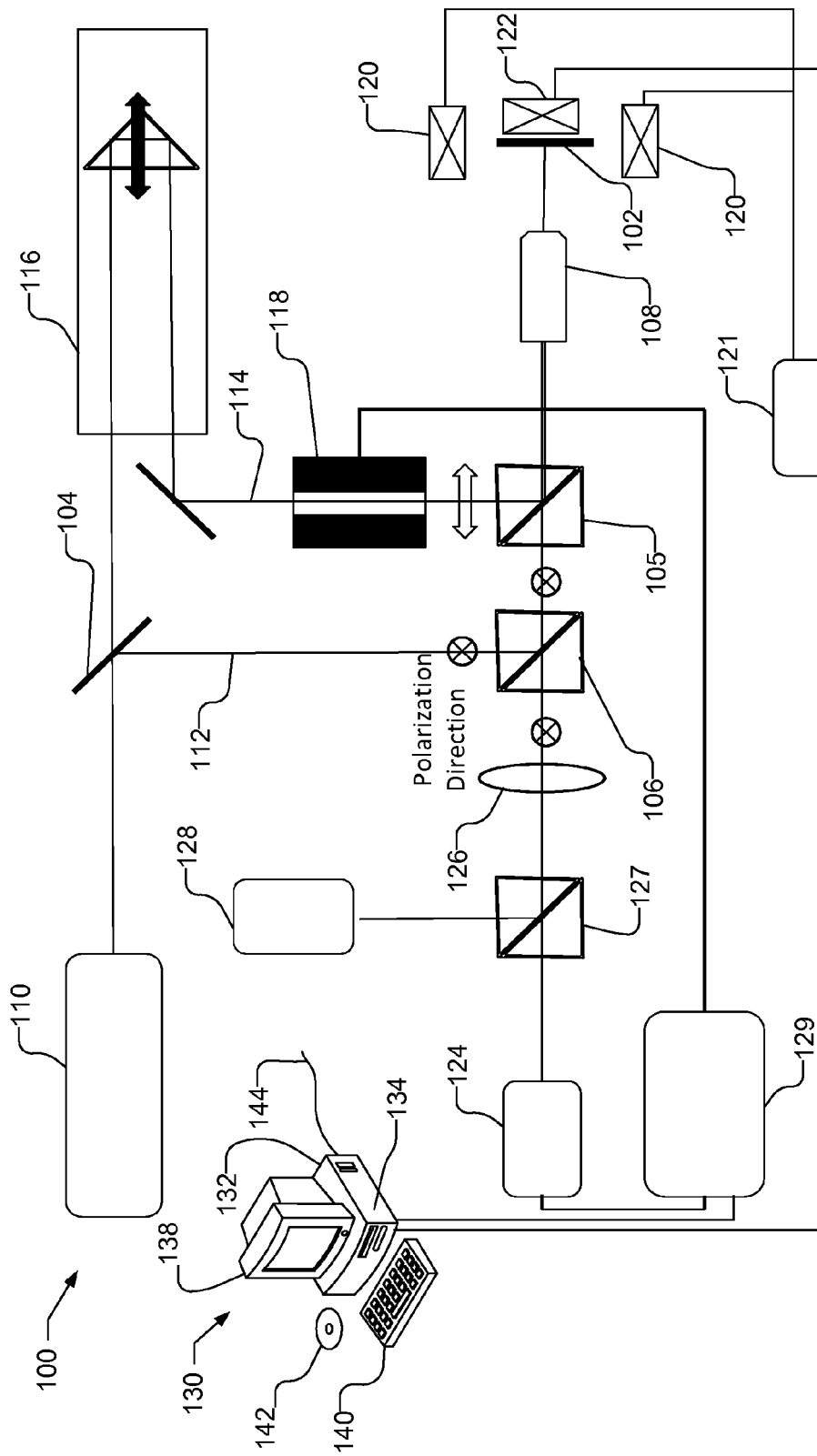
FIG. 1 illustrates a metrology device capable of a contactless measurement of resistance change in a magnetoresistive sample.

FIG. 1 is a schematic view of a metrology device 100 capable of a contactless measurement of resistance change in a magnetoresistive sample 102, which may be a magnetoresistive device or magnetoresistive material stack, such as magnetic read sensor and magnetic storage element, including Tunneling Magnetoresistance (TMR) sensors or Giant-Magneto Resistance (GMR) sensors used in magnetic data recording, magnetic sensors, and MRAM devices. The sample 102 may be at the wafer level, coupon level, or chip level. It may be particularly useful to measure the sensitivity of the sensor element, i.e. the change in sensor electric conductivity, or equivalently, its reciprocal quantity, electrical resistivity, with applied magnetic field before the read sensor or MRAM device is built, e.g., while at the wafer level.

Metrology device 100 measures a Time Domain Thermoreflectance (TDTR) signal from the sample 102 to determine the change in electrical conductivity based on the cooling behavior of the sample 102. The TDTR signal may be measured at different values of an applied magnetic field to determine the change in electrical conductivity as a function of magnetic field. Measurement of TDTR uses the thermoreflectance effect (optical reflectance of films vary with temperature) to measure the thermal conductivity of thin films. Optical reflectance is a function of the temperature of the material volume that is penetrated by the light. At very short heating times (t<1 ps), the thermal diffusion is purely normal to the surface of a thin film given that the heated area is much larger than the film thickness. In general, thermal material parameters of a thin film or stack of thin films can be extracted from the change in reflectance of the surface of the thin film over time, which may be used to produce a cooling curve. A cooling curve, for example, may be produced by heating the sample by a laser pulse (pump beam), e.g., that is less than 1 ps in duration, and sampling a change in the surface reflectance of the sample using a time delayed laser pulse (probe beam). For example, for a nanometer thick metallic film, the cooling rate is on the nanosecond time scale, and thus, the time delay increments used to monitor the change in reflectance should be on less than nanosecond time scale. A cooling curve is strongly affected by the interface conductance between thin film layers in the case of a thin film stack. In a metal, thermal conductivity is directly related to electric conductivity, as per the Wiedemann-Frantz (W-F) Law for heat conductance by electrons. Even if the heat and electrical transport processes in a sample, e.g., a GMR sensor, does not strictly follow the W-F law, there should still be a correlation between thermal and electrical conductivity. Thus, by optically measuring the change in optical reflectance from the surface of a sample, e.g., for one or more applied magnetic fields, the thermal conductivity may be determined, from which the electrical conductivity, or equivalently, the resistivity, of the sample may be determined. As is well known electrical conductivity is the inverse of resistivity, and therefore, as used herein, determining electrical conductivity is equivalent to determining resistivity, and thus, the terms electrical conductivity and resistivity may be used interchangeable herein.

Figure 2:
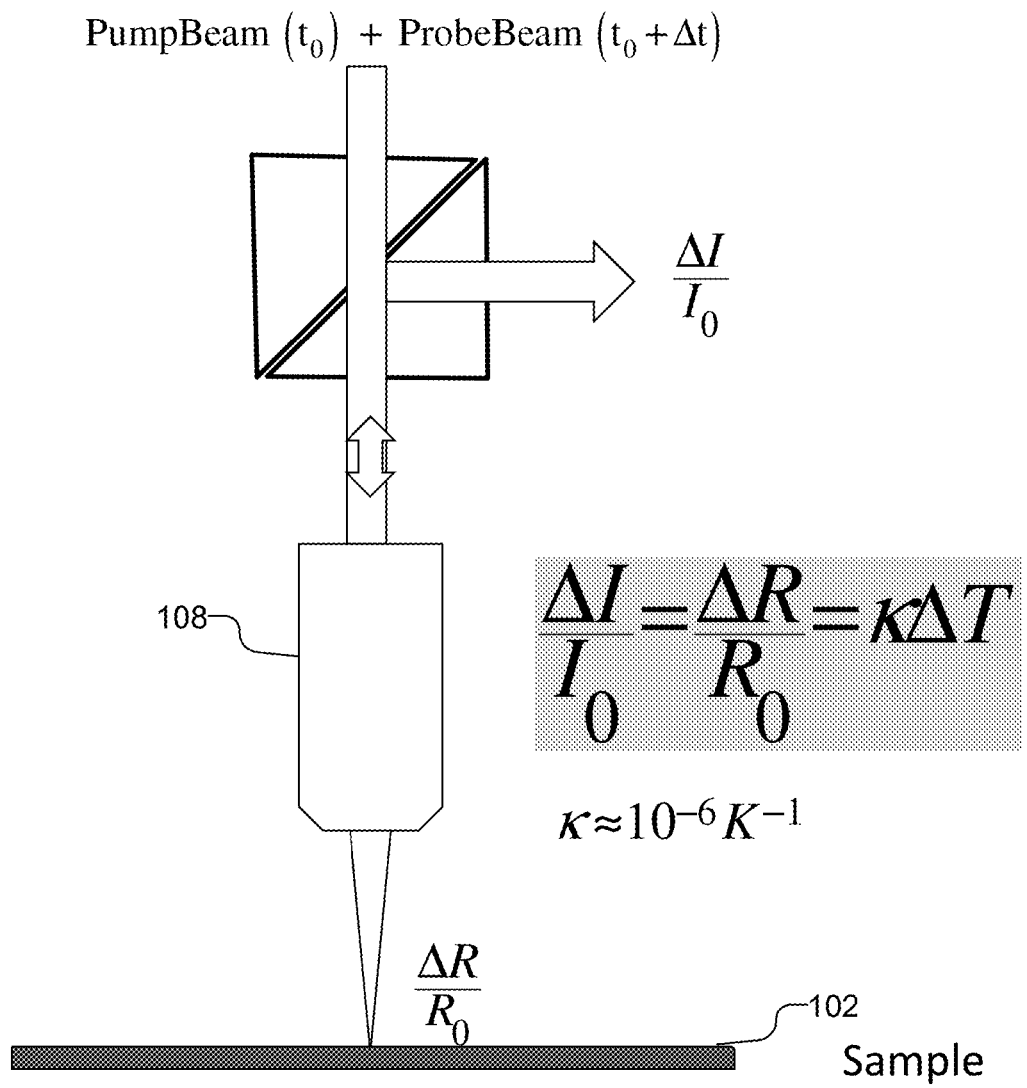
FIG. 2 illustrates the thermo reflectance measurement of a sample.

FIG. 2 illustrates the thermoreflectance measurement of a sample 102. Thermoreflectance measurements analyze the change of the optical reflectance of a sample as a function of surface temperature T. As illustrated, a pump beam is provided at time $t_0$, which is a short heating laser pulse that heats the surface of the sample. For example, the pump beam may be a train of femto-second laser pulses. The spot size produced by the objective lens 108 may be, e.g., 10 μm-15 μm, and is much greater than the film thickness, which may be, e.g., tens of nanometers. After a delay after the pump beam, a probe beam is provided, e.g., at time $t_0+\Delta t$, which is used to measure the reflectance of the sample. The delayed probe beam, for example, may be in time increments of e.g. 1 pico-second. When a train of pump and probe beams is used, the pump beam may be delayed instead of the probe beam. The reflectance may be measured, e.g., based on a measured intensity of the reflected light, as a function of time delay and converted to temperature to produce a cooling curve. The cooling curve of the thin film may be generated by probing the reflectance of the thin film with a time-delayed laser beam in time increments of e.g. 1 pico-second. As illustrated, the change in reflectance $\Delta R/R_0$ at the sample is equal to the measured change in intensity $\Delta I/I_0$, which is equal to a factor κ times the change in temperature $\Delta T$, where $I_0$ and $R_0$ are the initial measurement of intensity and reflectance, e.g., measured before the arrival of the heating pulse, i.e., at $t<t_0$. The quantities $I_0$ and $R_0$ are, thus, the measured intensity and the reflectance of the sample at a steady-state temperature, e.g., ambient temperature. The quantities $\Delta I$ and $\Delta R$ are the changes in intensity and reflectance from the initial measurement $T_0$ and $R_0$ to a subsequent measurement and $\kappa \approx 10^{-6} K^{-1}$, i.e., $$\frac{\Delta I}{I_0} = \frac{\Delta R}{R_0} = \kappa \Delta T. \qquad \text{eq. 1}$$

Thus, the measured changes in reflectance (based on the measured change in intensity) over time is equivalent to a change in temperature $\Delta T$ over time, which may be used to generate the cooling curve. By fitting the cooling curve to a thermal model, the thermal conductivity of a thin film or a stack of thin films can be determined. Because thermal conductivity is directly related to electric conductivity, the electrical conductivity, or equivalently, the resistivity, can be calculated based on the determined thermal conductivity.

Figure 3:
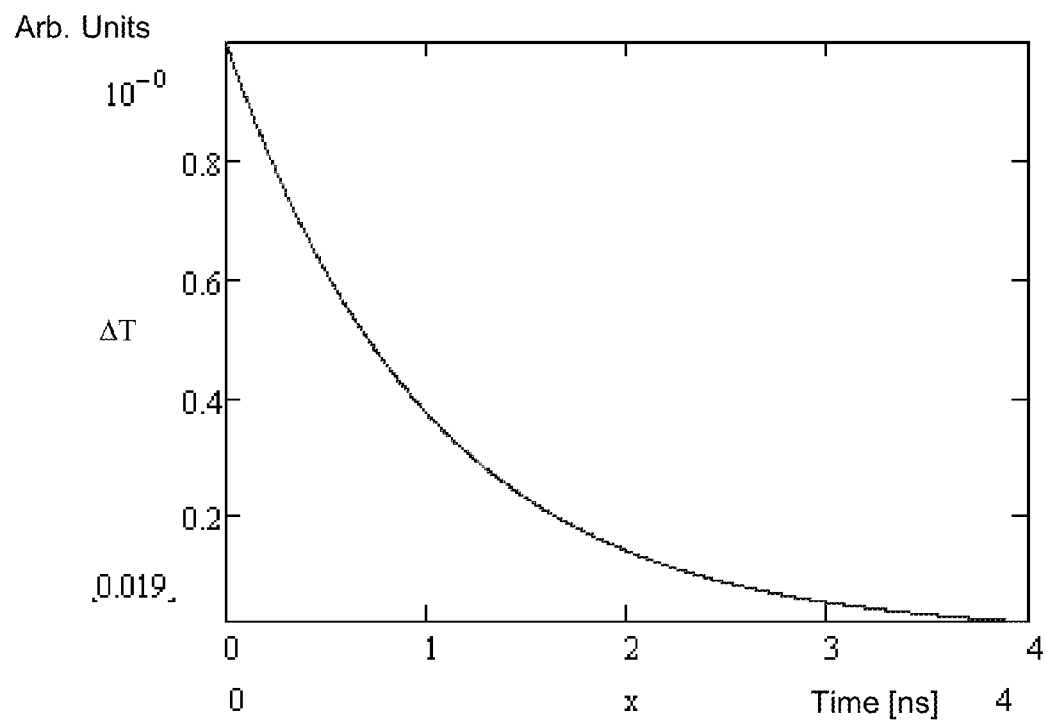
FIG. 3 illustrates a cooling curve of a sample after an instantaneous heating pulse.

With TDTR measurements, only the thermal properties of the top layer need to be known. A sample with a gold (Au) film on a silicon (Si) substrate with a thin silicon oxide (SiO2) interface is provided as an example. The temperature change $\Delta T$ is measured by the change in optical reflectance in the Au film as a function of temperature, where the reflectance change is approximately $10^{-6}$/K. The thermoreflectance may be written as:

$$\Delta T(t) = e^{-\frac{t}{\tau}}, \qquad \text{eq. 2}$$

with $$\tau = \frac{d_{Au} d_{SiO2} C_{Au}}{\Lambda_{SiO2}}$$

where Λ represents the thermal conductance, where $\Lambda_{SiO2} \ll \Lambda_{Au}$, and d represents the film thickness and $d_{Au}=30$ nm and $d_{SiO2}=1$ mm, and C represents heat capacitance, which is known from the bulk value. FIG. 3, by way of example, illustrates a cooling curve of such a sample in $\Delta T$, with an instantaneous initial probe pulse, i.e., t=0.

Figure 4:
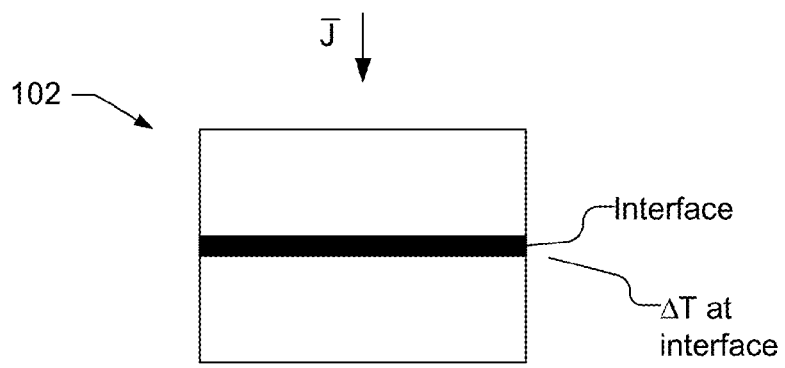
FIG. 4 illustrates a sample with an interface.

FIG. 4, by way of example, illustrates a sample 102 with an interface between two layers. The thermal conductance G is a property of a heat transport across the interface driven by the temperature gradient $\Delta T$ at the interface. Equivalent interface thickness (Kapitza length) L:

$$L = \frac{\Lambda}{G} \qquad \text{eq. 3}$$

$$G = \frac{1}{A k_B T^2} \int_0^\infty \langle q(t) q(0) \rangle dt \qquad \text{eq. 4}$$

$$J = G \Delta T. \qquad \text{eq. 5}$$

The Wiedemann-Franz law describes heat transport in metals by electrons at the Fermi level. The relation between electrical resistivity $\rho_e$ and the thermal conductivity Λ is:

$$\frac{\Lambda \rho_e}{T} = \frac{\pi^2 k}{3 e^2} \equiv L_0 \qquad \text{eq. 6}$$

where k is the Boltzmann constant, and $L_0$ is the Lorenz number $L_0=2.445 \times 10^{-8}$ WΩK$^{-2}$ and:

$$\frac{\Lambda}{\sigma} = L_0 T \qquad \text{eq. 7}$$

where σ is electrical conductivity. Correction factors A, B, C may be used for specific materials, e.g., $$\Lambda = A \frac{L_0 T}{\rho_e} + BT + C \qquad \text{eq. 8}$$

where for, e.g., aluminum, A=0.904, B=0, and C=5.27.

Referring back to FIG. 1, metrology device 100 includes a laser 110, such as a femto-second laser, which produces a beam that is split by a beam splitter 104 to produce a probe beam 112 and the pump beam 114. The type and wavelength of laser 110 may be selected based on the sample being measured and, in particular, the optical properties of the heating layer, i.e., the top layer, to maximize the change in reflectance with temperature. For example, the laser wavelength may be selected to minimize penetration of the probe beam 112 or pump beam 114 into the sample. The pump beam 114 passes through a variable optical delay element 116, which may be a movable linear stage or any other delay device, and passes through an electro-optic modulator 118, which is coupled to a lock-in amplifier, to produce a polarized and modulated pump beam, e.g., RMS power of 14 mW, pulse repetition frequency of 100 MHz and a pulse width of 100 fs. The pump beam 114 passes through a polarizing beam splitter 105, which is illustrated as reflecting light with the polarization state of the pump beam 114 and transmitting light with an orthogonal polarization state. The pump beam 114 passes through the objective lens 108 and is incident on the sample 102. As illustrated, the probe beam 112 is reflected by beam splitter 104 and a portion is reflected by beam splitter 106 towards polarizing beam splitter 105, which transmits the polarization state of the probe beam 112. The probe beam passes through the objective lens 108 and is incident on the sample 102. In a different implementation the pump beam and the probe beam may have different wavelengths and the same polarization, in which case beam splitter 105 may be a wavelength dependent beam splitter, which serves to combine the pump beam and the probe beam. The spot size of the pump beam 114, for example, may be a few micron, e.g. 10 µm, while the spot size of the probe beam 112 may be smaller than the spot size of the pump beam 114, e.g., 8 µm, which may be controlled, e.g., by collimating the probe beam 112 and pump beam 114 into different respective diameters before entrance to the objective lens 108. In general, the probe beam 112 may have a lower power than the pump beam 114, e.g., 8 mW, which may be controlled by the beam splitters 104 and 106 or other optical elements. While the probe beam 112 may increase the steady-state temperature (background) of the sample, the reflectance measurement by the probe beam 112 is quasi-instanteneous (femto-seconds), while the temperature increase of the sample has a greater time constant (pico-second), the probe beam 112 will measure the temperature increase caused by the pump beam 114. It should be understood that the metrology device 100 may have any desired variation of a TDTR measuring system.

The device 100 includes magnetic field sources, such as in-plane magnetic field source 120 and perpendicular magnetic field source 122, which may be e.g., electromagnets including coils, Helmholtz coils, or wound magnetic cores, and which are connected to a controller 121, e.g., a power supply, to set any desired magnetic field. If desired, the magnetic field sources 120 and 122 may be permanent magnets, which may be mechanically repositioned with respect to the sample 102, as controlled by controller 121, in order to vary the applied magnetic field during measurement. The applied magnetic field may be controlled to vary continuously or discretely during measurement.

The probe beam 112 is reflected by the sample 102. Thus, the light from the probe beam 112 passes through objective lens 108 after interacting with the sample 102 and is received by the polarizing beam splitter 105. The polarizing beam splitter 105 is illustrated as reflecting the pump beam 114 and transmitting the probe beam 112. The probe beam 112 is received by a photo detector 124, which detects the intensity of the reflected light. Additional elements, such as one or more lenses 126, beam splitters 127 and cameras 128 may be included. The detector 124 is coupled to the lock-in amplifier 129. The lock-in amplifier 129, thus, produces optically detected data and provides the optically detected data to a computer 130. The computer 130 is also illustrated as being coupled to the controller 121 by which the reflectance measurements may be synchronized with the magnetic fields applied by magnetic field sources 120 and 122. The computer 130 receives, stores, and analyzes the optically detected data provided by the detector 124. The computer 130 includes a processor 132 with memory 134, as well as a user interface including e.g., a display 138 and input devices 140. A non-transitory computer-usable storage medium 142 having computer-readable program code embodied may be used by the computer 130 for causing the processor to control the device and to perform a desired analysis, as described herein. The data structures and software code for automatically implementing one or more acts described in this detailed description can be implemented by one of ordinary skill in the art in light of the present disclosure and stored, e.g., on a non-transitory computer readable storage medium 142, which may be any device or medium that can store code and/or data for use by a computer system such as processor 132. The computer-usable storage medium 142 may be, but is not limited to, magnetic and optical storage devices such as disk drives, magnetic tape, compact discs, and DVDs (digital versatile discs or digital video discs). A communication port 144 may also be used to receive instructions that are used to program the computer 130 to perform any one or more of the functions described herein and may represent any type of communication connection, such as to the internet or any other computer network. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

For lock-in detection of the TDR signal, by way of example, the pump beam 114 may be modulated by a frequency f, which may be approximately 10 MHz to minimize lateral heat flow in the sample. The laser pulse separation time is τ. The lock-in response $V_{LI}$ of a modulated pump-probe reflectively measurement may be written:

TIME DOMAIN eq. 9

$$V_{LI} = \frac{\alpha}{\tau} \sum_{q=-\infty}^{+\infty} \exp(i2\pi f(q\tau + t))\Delta R(q\tau + t)$$

FREQUENCY DOMAIN eq. 10

$$\text{Re}\{\Delta R_M(t)\} = \frac{dR}{dT} \sum_{m=-M}^{M} \exp(i2\pi mt/\tau)(\Delta T(m/\tau + f) + \Delta T(m/\tau - f))$$

$$\text{Im}\{\Delta R_M(t)\} = -i\frac{dR}{dT} \sum_{m=-M}^{M} \exp(i2\pi mt/\tau)(\Delta T(m/\tau + f) - \Delta T(m/\tau - f))$$

The ratio of in-phase $V_{in}$ and out-of-phase $V_{out}$ signal is used to make the measurement less sensitive to focal shifts of the probe beam when the time delay is changed.

Figure 5:
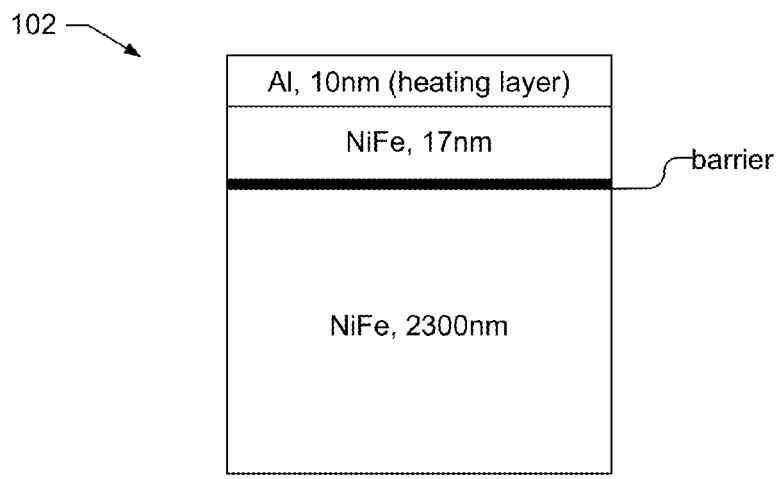
FIG. 5 illustrates a cross section of a magnetoresistive sample with a barrier layer.
Figure 6:
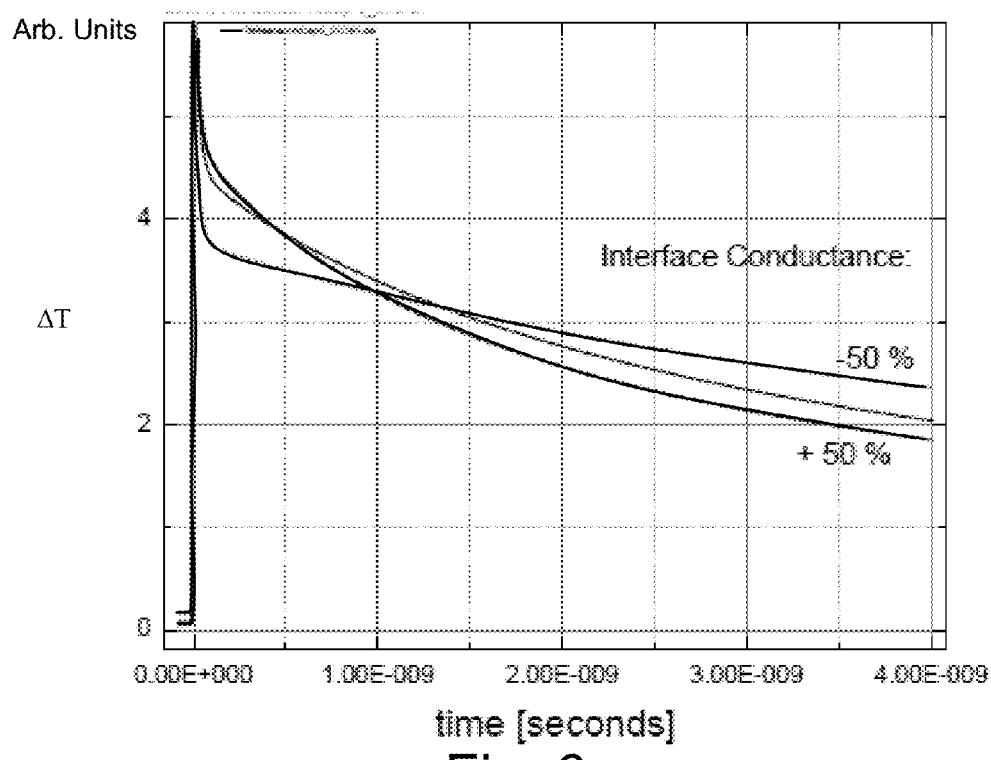
FIG. 6 is a calculated cooling curve for the sample, in which the barrier conductance varies by ±50%.

FIG. 5, by way of example, illustrates a cross section of another sample 102, which may be a TMR sensor with a number of layers and a non-metallic barrier layer in form of a tunneling junction. The tunneling junction is equivalent to the interface illustrated in FIG. 4. The barrier layer (tunnel junction in FIG. 5) is the part of the TMR sensor that changes electrical conductivity under the influence of the applied magnetic field and is, thus, the magnetoresistive element. The electrical conductivity of the other layers in the sensor stack is not impacted by the applied electrical field. The top layer may be a metal, such as e.g., Al, Au, Cu, Ru, Rh, Ta, Pt, Nb or other metals or combination of metals, with known thermal parameters and serves as the heating layer for the TDTR measurement. The thermal properties of the remaining layers are also known and the barrier layer is treated as an interface in the thermal model. FIG. 6 is a calculated cooling curve for a sample 102, such as that shown in FIG. 5, in which the barrier layer (interface) conductance varies by ±50%. The cooling curve is calculated as the lock-in output Re(A)/Im(A). As can be seen, the temperature variation in barrier (interface) conductance can be easily identified based on the cooling curve.

Accordingly, the electrical conductance (or equivalently, the resistivity) of the barrier may be determined from the cooling curve.

Moreover, as illustrated by the curves in FIG. 6, the barrier (interface) conductance may be easily distinguished and therefore characterized without generating a full cooling curve. For example, with cooling curves (such as those shown in FIG. 6) pre-generated for a sample with well known properties, a measured change in temperature (and thus, equivalently, a measured change in reflectance) of a production sample at a single delay after the heating pulse, e.g., at $3.5 \times 10^{-9}$ s in FIG. 6, may be used to characterize the resistivity properties of the barrier layer. Accordingly, a library may be generated for different properties of a sample that associates changes in reflectance with resistivity. During operation, the change in reflectance of a sample measured at a single delay after a heating pulse may be used to determine the resistivity of the magnetoresistive element in the sample using the library. If desired, multiple delays may be used to generate a cooling curve (or a partial cooling curve) which may be compared to a library to determine the resistivity. Further, measurements may be made at one or more magnetic fields in order to determine resistivity as a function of magnetic fields. Additionally, if desired, a library may be used for the intermediate step of determining the thermal conductance using the change in reflectance, and then the resistivity may be determined based on the thermal conductance.

If desired, the resistivity of the magnetoresistive sample may be used, e.g., to determine desired characteristic parameters of read sensors and MRAM devices, such as the "resistance-area product" (RA) and the "Magneto-Resistive Ratio" (MR). The resistance-area product RA parameter is directly related to the resistivity, and may be determined, e.g., as electrical resistivity times the area of the sample and may be determined with no external magnetic field or at any non-zero DC external magnetic field applied. The Magneto-Resistive Ratio MR parameter may be determined as the maximum change of electrical resistivity when the external field is applied to the sensor or the MRAM device and may be defined as MR=dR/R expressed as a percentage value. The MR parameter yields a measure of the sensitivity of the sensor and may be a function of the external magnetic field. Additional measurements that may be generated include, e.g., a transfer curve by measuring MR at multiple external magnetic fields, e.g., the magnetic fields may have a 0, a +Oe value, and a −Oe value (or sequence of +/−Oe values). Additionally, hysteresis may be measured using a number of external magnetic fields. If desired, a pre-Stress may be applied, e.g., with perhaps a significantly larger external magnetic field applied before any measurements are taken. The stability of the RA or MR measurements may be determined with rerunning multiple cycles. Additionally, Barkhausen jumps, i.e., non-linearities in resistance change vs. external magnetic field, may be measured using the measured MR as a function of external magnetic field.

Figure 7:
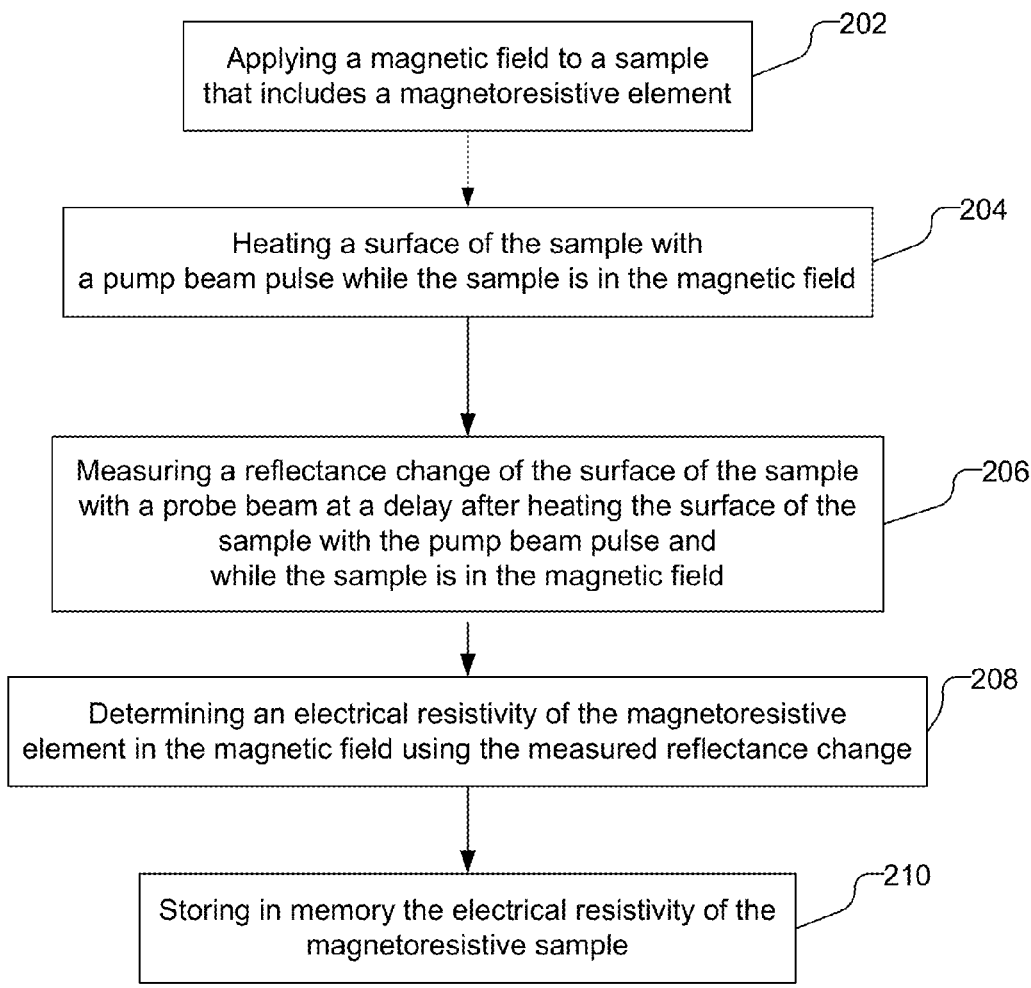
FIG. 7 is a flow chart illustrating the process of optically measuring electrical conductivity in a magnetoresistive sample, such as a read sensor and storage element.

FIG. 7 is a flow chart illustrating the process of optically measuring resistivity in a sample that includes a magnetoresistive element, including a magnetoresistive device or magnetoresistive material stack, used in magnetic data recording, magnetic sensors, and MRAM devices. The magnetoresistive element may be a Tunneling Magnetoresistance (TMR) sensor or a Giant-Magneto Resistance (GMR) sensor and may be in a wafer level, coupon level or chip level. As illustrated, a magnetic field may be applied to a sample that includes a magnetoresistive element (202). The surface of the sample is heated with a pump beam pulse while the sample is in the magnetic field, if a magnetic field is applied (204). A reflectance change of the surface of the sample is measured with a probe beam at a delay time after heating the surface of the sample with the pump beam pulse and while the sample is in the magnetic field, if a magnetic field is applied (206). The reflectance change may be measured based on a measured change in intensity that is normalized with respect to an initial intensity that is measured before heating the sample. An electrical resistivity of the magnetoresistive element in the magnetic field, if a magnetic field is applied, is determined using the measured reflectance change (208). For example, a library that includes reflectance values with corresponding electrical resistivity values may be searched using the reflectance change. The electrical resistivity of the magnetoresistive sample is stored in memory (210). If desired, at least one of a resistance-area product or a Magneto-Resistive Ratio may be determined using the electrical resistivity.

If desired, a plurality of reflectance changes of the surface of the sample may be measured for different delays. For example, each reflectance change may be measured at a different delay after heating the surface of the sample. The electrical resistivity of the magnetoresistive element may be determined based on the plurality of reflectance changes. For example, a cooling curve may be generated using the plurality of reflectance changes and a library that includes cooling curves with corresponding electrical resistivity values may be searched using the cooling curve. Additionally, a plurality of magnetic fields may be applied and the electrical resistivity of the magnetoresistive element determined in each magnetic field of the plurality of magnetic fields. If desired, one of the magnetic fields may have zero magnitude, i.e., no magnetic field is applied to the magnetoresistive element. If desired, the electrical resistivity may be determined, e.g., by determining the thermal conductivity of the sample using the change in reflectance and determining the electrical resistivity using the thermal conductivity. The electrical resistivity as a function of magnetic field may be used to determine, e.g., a transfer curve, hysteresis, or Barkhausen jump.

Figure 8:
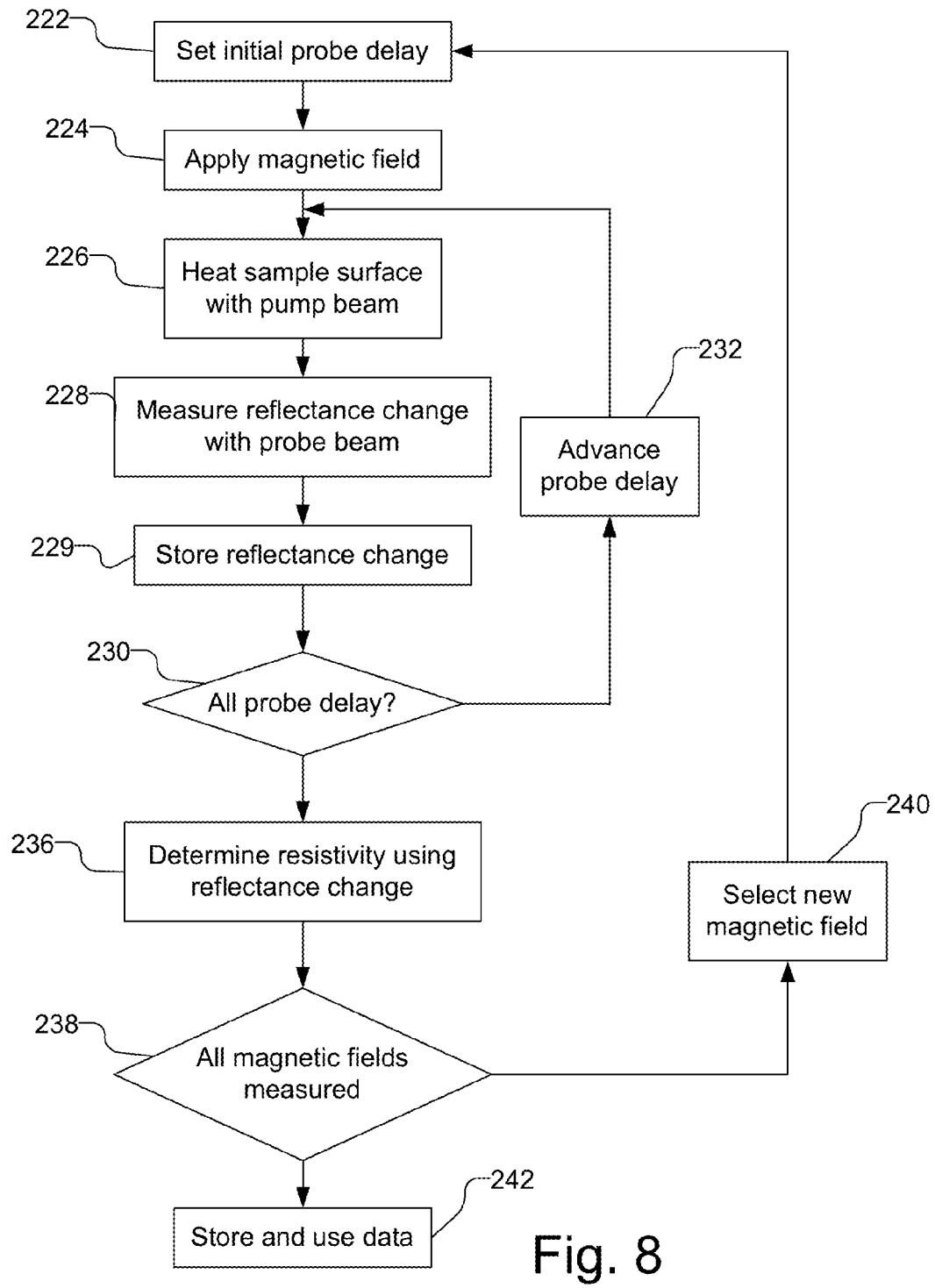
FIG. 8 is a flow chart illustrating the process of optically measuring electrical conductivity in a magnetoresistive sample, such as a read sensor and storage element, with optional multiple applied magnetic fields and probe delays.

FIG. 8 is another flow chart illustrating a method of measuring resistivity using optional multiple applied magnetic fields and probe delays. FIG. 8, like FIG. 7, illustrates the process of optically measuring resistivity in a magnetoresistive sample, including a magnetoresistive device or magnetoresistive material stack, used in magnetic data recording, magnetic sensors, and MRAM devices. As illustrated, an initial probe delay is set (222). The initial delay may be zero or may be some pre-determined sensitive delay amount, e.g., such as $3.5 \times 10^{-9}$ as described in FIG. 6. An external magnetic field may be generated and applied to the sample (224). The sample surface is illuminated with the pump laser beam (226) and the sample surface reflectance change is measured with the probe beam (228) and is stored (229) in computer memory 134. The reflectance change may be measured based on a measured change in intensity that is normalized with respect to an initial intensity that is measured before heating the sample. If additional probe delays i.e., Δt, are desired (230), the probe delay Δt is advanced (232) and the surface is illuminated with the pump beam (226) and the reflectance change measured with the probe beam (228) again. As discussed above, however, only a single probe delay Δt may be used. If no additional probe delays Δt are desired (230), the resistivity of the magnetoresistive element of the sample is determined, e.g., by fitting a model with the reflectance change that depends on the nature of the device under test, e.g., a TMR sensor or a GMR sensor. If reflectance changes are generated for multiple probe delays Δt, the multiple reflectance changes may be used to determine resistivity. In one implementation, a cooling curve may be generated and used to determine the electrical resistivity. For example, the cooling curve may be used to look up a resistivity or to fit to a thermal model to determine the thermal conductance of the magnetoresistive element and the electrical resistivity determined based on the thermal conductivity. The thermal model may be based on a one-dimensional solution of the thermal diffusion equation for multiple layers of materials with a set of thermal material constants. If desired, the multiple reflectance changes may be used to determine resistivity without generating a cooling curve, e.g., using a statistical analysis of the multiple reflectance changes and a look up table. Additionally, if a single reflectance change is determined, the thermal conductivity of the magnetoresistive element may be determined using the measured reflectance change, and the electrical resistivity of the magnetoresistive element determined using the thermal conductivity. If all desired magnetic fields have been measured (238), the process ends, otherwise, a new magnetic field is selected (240) and the process repeats. If desired, one of the magnetic fields (including the initial magnetic field in 224) may have zero magnitude, i.e., no magnetic field is applied to the sample. The resulting resistivity of the magnetoresistive element of the sample is stored in memory and may be used (242), e.g., to determine the resistance-area product or a Magneto-Resistive Ratio, which may be used to determine at least one of transfer curve, hysteresis, and Barkhausen jump as discussed above, or to accept or reject the sample (242). It should be understood that certain process steps may be performed in orders different than that illustrated in FIG. 8. For example, if desired, all magnetic fields may be measured (238) before advancing probe delays (232) and determining resistivity using the reflectance change (236).

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method comprising:
   applying a plurality of magnetic fields to a sample that includes a magnetoresistive element;
   heating a surface of the sample that includes the magnetoresistive element with a pump beam pulse while applying each of the plurality of magnetic fields;
   measuring a reflectance change of the surface of the sample with a probe beam at a delay after heating the surface of the sample with the pump beam pulse for each of the plurality of magnetic fields;
   determining an electrical resistivity of the magnetoresistive element as a function of magnetic field using the measured reflectance change;
   determining a characteristic parameter of the magnetoresistive element based on a change in the electrical resistivity of the magnetoresistive element as the function of magnetic field; and
   storing in memory the characteristic parameter of the magnetoresistive element in the sample.

2. The method of claim 1, wherein determining the electrical resistivity of the magnetoresistive element comprises searching a library that includes reflectance change values with corresponding electrical resistivity values using the measured reflectance change.

3. The method of claim 1, further comprising measuring a plurality of reflectance changes of the surface of the sample for each of the plurality of magnetic fields, wherein each reflectance change of the plurality of reflectance changes is measured at a different delay after heating the surface of the sample, and wherein determining the electrical resistivity of the magnetoresistive element in the sample using the measured reflectance change comprises using the plurality of reflectance changes to determine the electrical resistivity.

4. The method of claim 3, wherein using the plurality of reflectance changes to determine the electrical resistivity comprises:
   generating a cooling curve using the plurality of reflectance changes; and
   using the cooling curve to determine the electrical resistivity of the magnetoresistive element.

5. The method of claim 4, wherein using the cooling curve to determine the electrical resistivity of the magnetoresistive element comprises:
   fitting the cooling curve to a thermal model of the sample to determine a thermal conductivity of the magnetoresistive element; and
   determining the electrical resistivity of the magnetoresistive element using the thermal conductivity of the magnetoresistive element.

6. The method of claim 1, wherein determining the electrical resistivity of the magnetoresistive element using the measured reflectance change comprises:
   determining a thermal conductivity of the magnetoresistive element using the measured reflectance change; and
   determining the electrical resistivity of the magnetoresistive element using the thermal conductivity of the magnetoresistive element.

7. The method of claim 1, further comprising determining the electrical resistivity of the magnetoresistive element when no magnetic field is applied to the sample.

8. The method of claim 1, further comprising determining at least one of transfer curve, hysteresis, and Barkhausen jump using the electrical resistivity as the function of magnetic field.

9. The method of claim 1, further comprising determining at least one of a resistance-area product or a Magneto-Resistive Ratio using the electrical resistivity.

10. The method of claim 1, wherein the magnetoresistive element is one of a Tunneling Magnetoresistance (TMR) sensor, a Giant-Magneto Resistance (GMR) sensor, or an Magnetic Random Access memory (MRAM) device.

11. The method of claim 1, wherein the sample is in a wafer level, coupon level or chip level.

12. The method of claim 1, wherein the characteristic parameter of the magnetoresistive element is a sensitivity of the magnetoresistive element as the function of magnetic field.

13. An apparatus comprising:
    a magnetic field source configured to apply a plurality of magnetic fields to a sample that includes a magnetoresistive element;
    a time domain thermoreflectance metrology device configured to measure a reflectance change of a surface of the sample that includes the magnetoresistive element with a probe beam at a delay after heating the surface of the sample with a pump beam pulse, wherein the time domain thermoreflectance metrology device measures the reflectance change of the surface of the sample while the sample is in each magnetic field of the plurality of magnetic fields;
    a processor coupled to the time domain thermoreflectance metrology device to receive the reflectance change, the processor configured to determine an electrical resistivity of the magnetoresistive element as a function of magnetic field based on the measured reflectance change, to determine a characteristic parameter of the magnetoresistive element based on a change in the electrical resistivity of the magnetoresistive element as the function of magnetic field and to store the characteristic parameter electrical resistivity for the magnetoresistive element in the sample in a memory.

14. The apparatus of claim 13, wherein the processor is configured to determine the electrical resistivity of the magnetoresistive element by being configured to search a library that includes reflectance change values with corresponding electrical resistivity values using the reflectance change.

15. The apparatus of claim 13, wherein the time domain thermoreflectance metrology device is configured to measure a plurality of reflectance changes of the surface of the sample for each of the plurality of magnetic fields, wherein each reflectance change of the plurality of reflectance changes is measured at a different delay after heating the surface of the sample, and wherein the processor is configured to determine the electrical resistivity of the magnetoresistive element in the sample based on the measured reflectance change by being configured to use the plurality of reflectance changes to determine the electrical resistivity.

16. The apparatus of claim 15, wherein the processor is configured to use the plurality of reflectance changes to determine the electrical resistivity by being configured to:
    generate a cooling curve using the plurality of reflectance changes; and
    use the cooling curve to determine the electrical resistivity of the magnetoresistive element.

17. The apparatus of claim 16, wherein the processor is configured to use the cooling curve to determine the electrical resistivity of the magnetoresistive element by being configured to:
    fit the cooling curve to a thermal model of the sample to determine a thermal conductivity of the magnetoresistive element; and
    determine the electrical resistivity of the magnetoresistive element using the thermal conductivity of the magnetoresistive element.

18. The apparatus of claim 13, wherein the processor is configured to determine the electrical resistivity of the magnetoresistive element using the measured reflectance change by being configured to:
    determine a thermal conductivity of the magnetoresistive element using the measured reflectance change; and
    determine the electrical resistivity of the magnetoresistive element using the thermal conductivity of the magnetoresistive element.

19. The apparatus of claim 13, wherein the processor is further configured to determine the electrical resistivity of the magnetoresistive element when no magnetic field is applied to the sample.

20. The apparatus of claim 13, wherein the processor is further configured to determine at least one of transfer curve, hysteresis, and Barkhausen jump using the electrical resistivity as the function of magnetic field.

21. The apparatus of claim 13, wherein the processor is further configured to determine at least one of a resistance-area product or a Magneto-Resistive Ratio using the electrical resistivity.

22. The apparatus of claim 13, wherein the magnetoresistive element is one of a Tunneling Magnetoresistance (TMR) sensor, a Giant-Magneto Resistance (GMR) sensor, or an Magnetic Random Access memory (MRAM) device.

23. The apparatus of claim 13, wherein the sample is in a wafer level, coupon level or chip level.

24. The apparatus of claim 13, wherein the characteristic parameter of the magnetoresistive element is a sensitivity of the magnetoresistive element as the function of magnetic field.

* * * * *